United States Patent
Cho (10) Patent No.: US 7,616,037 B2
(45) Date of Patent: Nov. 10, 2009

(54) METHOD AND APPARATUS FOR CONTROLLING POWER-DOWN MODE OF DELAY LOCKED LOOP

(75) Inventor: Yong-ho Cho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 84 days.

(21) Appl. No.: 12/027,716

(22) Filed: Feb. 7, 2008

(65) Prior Publication Data

US 2008/0204095 A1 Aug. 28, 2008

(30) Foreign Application Priority Data

Feb. 22, 2007 (KR) ............... 10-2007-0018097

(51) Int. Cl.
*H03L 7/06* (2006.01)
(52) U.S. Cl. .................. 327/158; 327/149; 327/156
(58) Field of Classification Search .......... 327/147, 327/149, 156, 158, 161
See application file for complete search history.

(56) References Cited

U.S. PATENT DOCUMENTS

| | | | |
|---|---|---|---|
| 6,525,578 B2* | 2/2003 | Ooishi | 327/156 |
| 7,148,730 B2* | 12/2006 | Park | 327/149 |
| 7,405,603 B2* | 7/2008 | Ku | 327/158 |
| 7,501,866 B2* | 3/2009 | Choi | 327/156 |
| 7,515,003 B2* | 4/2009 | Park | 331/16 |
| 7,528,639 B2* | 5/2009 | Choi | 327/158 |
| 7,542,358 B2* | 6/2009 | Jang | 365/194 |
| 2006/0038601 A1* | 2/2006 | Giguere et al. | 327/291 |
| 2006/0250172 A1* | 11/2006 | Kim | 327/158 |
| 2008/0001640 A1* | 1/2008 | Choi | 327/158 |
| 2008/0279016 A1* | 11/2008 | Jang | 365/189.05 |
| 2008/0284476 A1* | 11/2008 | Kwan et al. | 327/156 |
| 2009/0015302 A1* | 1/2009 | You | 327/158 |
| 2009/0115474 A1* | 5/2009 | Lee | 327/158 |

FOREIGN PATENT DOCUMENTS

| | | |
|---|---|---|
| JP | 2002-100980 | 4/2002 |
| JP | 2003-272380 | 9/2003 |
| KR | 1020040046326 A | 6/2004 |

* cited by examiner

*Primary Examiner*—Lincoln Donovan
*Assistant Examiner*—Adam D Houston
(74) *Attorney, Agent, or Firm*—F. Chau & Associates, LLC (57) ABSTRACT

A method and apparatus for controlling a power-down mode of a delay locked loop (DLL), in which the apparatus includes a first switch unit, a DLL, and a second switch unit. The first switch unit transfers a first clock signal in response to a clock input enable signal. The DLL receives the first clock signal through the first switch unit to generate a second clock signal and is turned off by a power-down signal that is generated from the first clock signal latched by the first switch unit. The second switch unit transfers the second clock signal in response to a clock output enable signal. In a power-down mode, the clock input enable signal is deactivated in response to a clock enable signal and the clock output enable signal is deactivated after a predetermined number of clock cycles that are necessary for the latched first clock signal to be completely transferred through the delay cells of the DLL to an output terminal of the DLL. In a power-down exit mode, the power-down signal is deactivated in response to the clock enable signal and the clock input enable signal and the clock output enable signal are activated after a predetermined number of clock cycles that are necessary for the latched second clock signal to be completely transferred through the delay cells of the DLL to the output terminal of the DLL.

22 Claims, 5 Drawing Sheets

METHOD AND APPARATUS FOR CONTROLLING POWER-DOWN MODE OF DELAY LOCKED LOOP

CROSS-REFERENCE TO RELATED PATENT APPLICATION

This application claims the benefit of Korean Patent Application No. 10-2007-0018097, filed on Feb. 22, 2007, in the Korean Intellectual Property Office, the disclosure of which is incorporated herein in its entirety by reference.

BACKGROUND OF THE INVENTION

1. Technical Field

The present disclosure relates to a semiconductor memory device and, more particularly, to a method and apparatus for controlling a power-down mode of a delay locked loop (DLL).

2. Discussion of Related Art

A conventional dynamic random access memory (DRAM) memory device has an internal clock system that receives an external clock signal and generates a plurality of different internal clock signals for controlling internal operations of the conventional DRAM memory device using the received external clock signal. An internal clock system of a conventional DRAM memory device is well-known to one of ordinary skill in the art and is a clock domain that is provided by a delay locked loop (DLL) that generates an internal clock signal having a predetermined phase relationship with an external clock signal.

The conventional DRAM memory device is connected to a memory controller that commands read/write operations. Conventionally, the memory controller expects valid data to be loaded on a data bus with a predetermined read latency, that is, after several, for example, seven, external clock cycles from a read command. Accordingly, the conventional DRAM memory device supports a suitable latency using a DLL and a latency counter.

Figure 1:
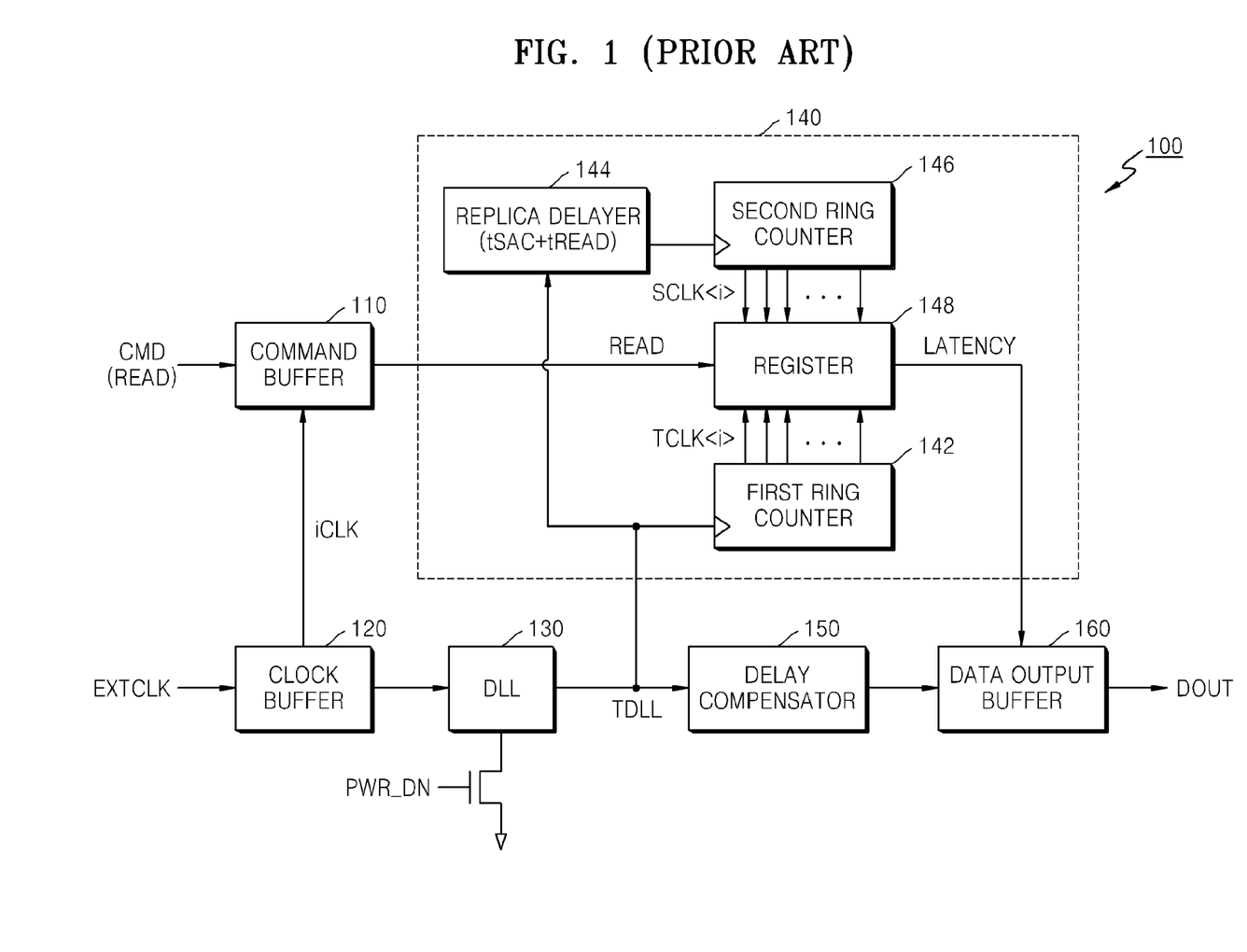
FIG. 1 is a block diagram of a conventional dynamic random access memory (DRAM) memory device using a pointer-based latency counter.

FIG. 1 is a block diagram of a conventional DRAM memory device 100 using a pointer-based latency counter 140.

Referring to FIG. 1, the conventional DRAM memory device 100 includes a command buffer 110, a clock buffer 120, a DLL 130, the pointer-based latency counter 140, a delay compensator 150, and a data output buffer 160. The conventional DRAM memory device 100 receives a read command CMD (READ) through the command buffer 110 and receives an external clock signal EXTCLK through the clock buffer 120. The buffered external clock signal EXTCLK is applied to the DLL 130 to generate an internal clock signal TDLL of the conventional DRAM memory device 100.

The pointer-based latency counter 140 includes a first ring counter 142, a replica delayer 144, a second ring counter 146, and a register 148. The first ring counter 142 receives the internal clock signal TDLL from the DLL 130 to generate first pulse signals TCLK(i), shown in FIG. 2. The replica delayer 144 delays the internal clock signal TDLL by a delay time tSAC+tREAD and transfers the delayed internal clock signal TDLL to the second ring counter 146. The time tSAC denotes a delay time from when the internal clock signal TDLL is generated to when the data DOUT is outputs and the time tREAD denotes a delay time that is taken to transfer the read command READ synchronized with the external clock signal EXTCLK to the pointer-based latency counter 140. The replica delayer 144 includes a replica of circuits on a tSAC path and a replica of circuits on a tREAD path.

Figure 2:
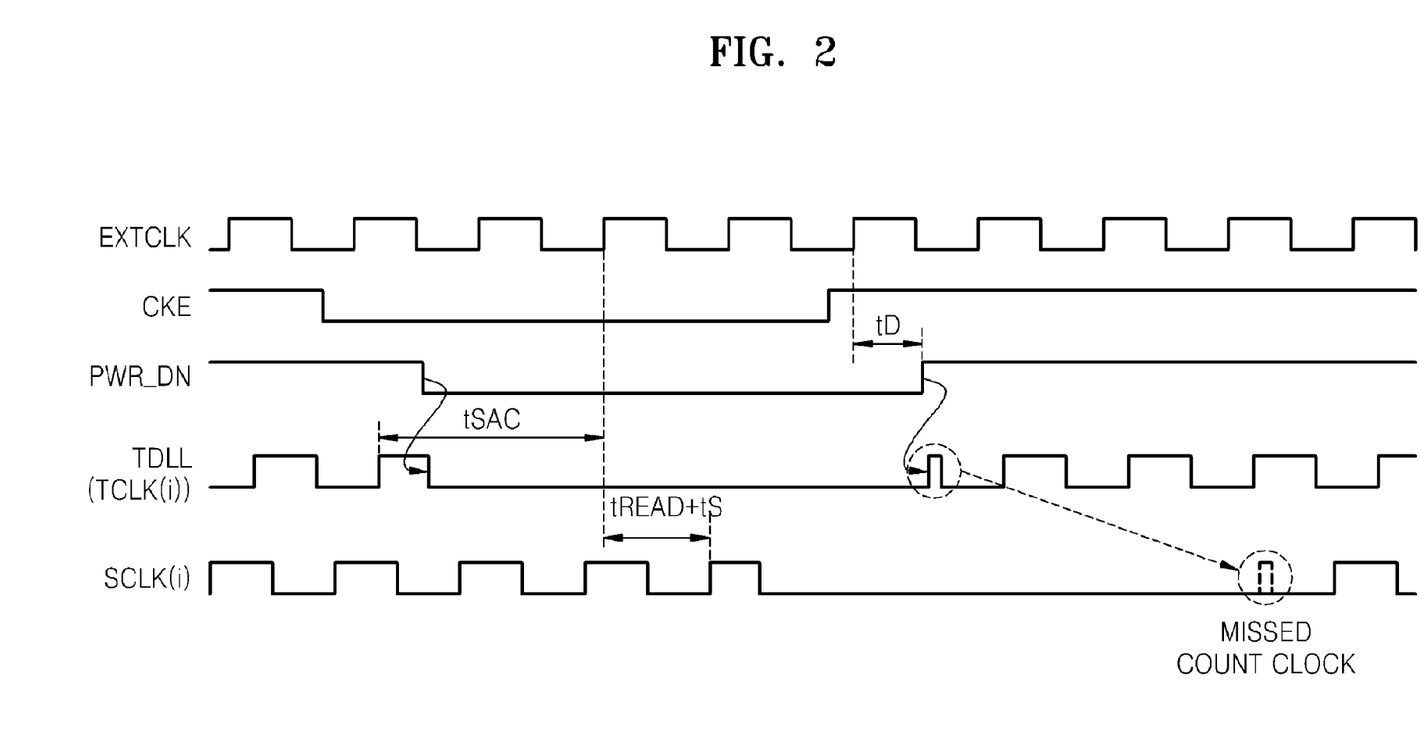
FIG. 2 is a timing diagram illustrating an example where an error occurs in the pointer-based latency counter in a power-down exit mode of a DLL of the conventional memory device illustrated in FIG. 1.

The second ring counter 146 receives the delayed internal clock signal from the replica delayer 144 to generate second pulse signals SCLK(i), shown in FIG. 2. In response to the second pulse signals SCLK(i), the register 148 samples and stores a buffered read command READ received from the command buffer 110. In response to the first pulse signals TCLK(i), the register 148 samples the stored read command to generate a latency signal LATENCY.

For a normal latency control operation, the pointer-based latency counter 140 must always maintain the delay time tSAC+tREAD between the first pulse signal TCLK(i) and the second pulse signal SCLK(i). Therefore, a glitch clock pulse must not be inputted into the pointer-based latency counter 140.

In a system using a high-capacity memory device, however, a power-down mode current may affect the system power. In the conventional DRAM memory device 100, most of the current is consumed by the DLL 130 and the pointer-based latency counter 140 during a pre-charge state before entry into a power-down mode. The DLL 130 consumes current by having analog circuits including delay cells and the pointer-based latency counter 140 consumes current by the clock switching of the ring counters. When a glitch clock pulse is inputted into the pointer-based latency counter 140, an error may occur in the latency control. Therefore, the DLL 130 is not allowed to be powered down in a power-down mode of the DRAM. If the DLL 130 is allowed to be powered down in the power-down mode of the DRAM, a power-down current can be greatly reduced. In the DRAM memory device 100 shown in FIG. 1 power down is performed by connecting the DLL 130 to ground under control of power down signal PWR_DN.

FIG. 2 is a timing diagram illustrating an example where an error occurs in the pointer-based latency counter 140 in a power-down exit mode of the DLL 130.

Referring to FIGS. 1 and 2, if the DLL 130 is powered down while the power-down signal PWR_DN has a logic level "LOW", and then the power-down signal PWR_DN changes into a logic level "HIGH", the internal clock signal TDLL is generated. The time tSAC and the delay time to of the power-down signal PWR_DN are constant independently of the period of the external clock signal EXTCLK. Accordingly, the power-down signal PWR_DN may not be synchronized with the internal clock signal TDLL. In addition, a glitch clock pulse may occur in the internal clock signal TDLL when the power-down signal PWR_DN changes.

The pulse width of the glitch clock pulse varies according to the frequency of the internal clock signal TDLL. The glitch clock pulse with a predetermined pulse width serves as a count clock pulse in the first ring counter 142. The glitch clock pulse, however, cannot serve as a count clock pulse in the second ring counter 146 when the glitch clock pulse disappears while passing through the replica delayer 144. Accordingly, the delay time between the first pulse signals TCLK(i) and the second pulse signals SCLK(i) becomes different from the intended delay time tSAC+tREAD, which causes an error in the latency signal LATENCY.

SUMMARY OF THE INVENTION

Exemplary embodiments of the present invention provide a memory device that can prevent the occurrence of a glitch clock pulse in a delay locked loop (DLL).

Exemplary embodiments of the present invention also provide a method for controlling a DLL of a memory device.

According to an exemplary embodiment of the present invention, there is provided a memory device including a first switch unit transferring a first clock signal in response to a clock input enable signal; a delay locked loop (DLL) receiving the first clock signal through the first switch unit to generate a second clock signal, and being turned off by a power-down signal that is generated from the first clock signal latched by the first switch unit; and a second switch unit transferring the second clock signal in response to a clock output enable signal.

The memory may further include a control signal generator generating the clock input enable signal, and the control signal generator may include a plurality of first flip-flops serially connected to receive a clock enable signal in response to the first clock signal; an AND gate receiving the outputs of the first flip-flops to output a control signal; and a second flip-flop receiving the control signal and generating the clock input enable signal in response to an inverted first clock signal. The first flip-flops may be as many as the number of clock cycles that are necessary for the latched first clock signal to be completely transferred through the delay cells of the DLL to an output terminal of the DLL.

The memory device may further include a clock output enable signal generator generating the clock output enable signal, and the clock output enable signal generator may include a plurality of serially connected flip-flops to receive a clock enable signal in response to the first clock signal; an OR gate receiving the outputs of the flip-flops to generate a control signal; an inverter receiving the control signal; a first delayer inverting and delaying the output of the inverter; a first NAND gate receiving the output of the inverter and the output of the first delayer; a second NAND gate receiving the clock output enable signal and the output of the first NAND gate; a buffer receiving the clock input enable signal; a second delayer inverting and delaying the output of the buffer; a third NAND gate receiving the output of the buffer and the output of the second delayer; and a fourth NAND gate receiving the output of the second NAND gate and the output of the third NAND gate to output the clock output enable signal. The flip-flops may be as many as the number of clock cycles that are necessary for the latched first clock signal to be completely transferred through delay cells of the DLL to an output terminal of the DLL.

The memory may further include an inverter chain receiving and delaying the control signal to generate the power-down signal.

According to an exemplary embodiment of the present invention, there is provided a memory device including a control circuit generating a clock input enable signal, a clock output enable signal, and a power-down signal in response to a clock enable signal, a first switch unit transferring a first clock signal in response to the clock input enable signal; a delay locked loop (DLL) receiving the first clock signal through the first switch unit to generate a second clock signal; a DLL power-down unit turning off the DLL in response to the power-down signal; and a second switch unit transferring the second clock signal in response to the clock output enable signal.

The DLL power-down unit may include a current sink blocking a path from the DLL to a ground voltage point in response to the power-down signal.

According to an exemplary embodiment of the present invention, there is provided a method for controlling a delay locked loop (DLL) including generating a clock input enable signal and a clock output enable signal in response to a clock enable signal; transferring a first clock signal to the DLL or latching the first clock signal in response to the clock input enable signal; generating a second clock signal synchronized with the first clock signal at the DLL; transferring the second clock signal to a data output buffer in response to the clock output enable signal; generating a power-down signal when the clock enable signal is deactivated continuously for a predetermined number of clock cycles; and turning off the DLL in response to the power-down signal.

The power-down signal may be generated after a predetermined number of clock cycles that are necessary for the latched first clock signal to be completely transferred through the delay cells of the DLL to an output terminal of the DLL.

The clock input enable signal may be activated after a predetermined number of clock cycles of the first clock signal which are necessary for the latched first clock signal to be completely transferred through the delay cells of the DLL to an output terminal of the DLL from the time point when the clock enable signal is activated.

The clock output enable signal may be activated or deactivated after a predetermined number of clock cycles of the first clock signal, which are necessary for the latched first clock signal to be completely transferred through the delay cells of the DLL to an output terminal of the DLL from the time point when the clock enable signal is activated or deactivated.

According to an exemplary embodiment of the present invention, a glitch clock pulse does not occur at the DLL in a power-down mode and a power-down exit mode of the memory device. Accordingly, a latency counter of the memory device does not need a circuit for initializing a clock signal.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

The present invention will now be described more fully with reference to the accompanying drawings, in which exemplary embodiments of the invention are shown. Like reference numerals in the drawings denote like elements, and thus their description will be omitted.

Figure 3:
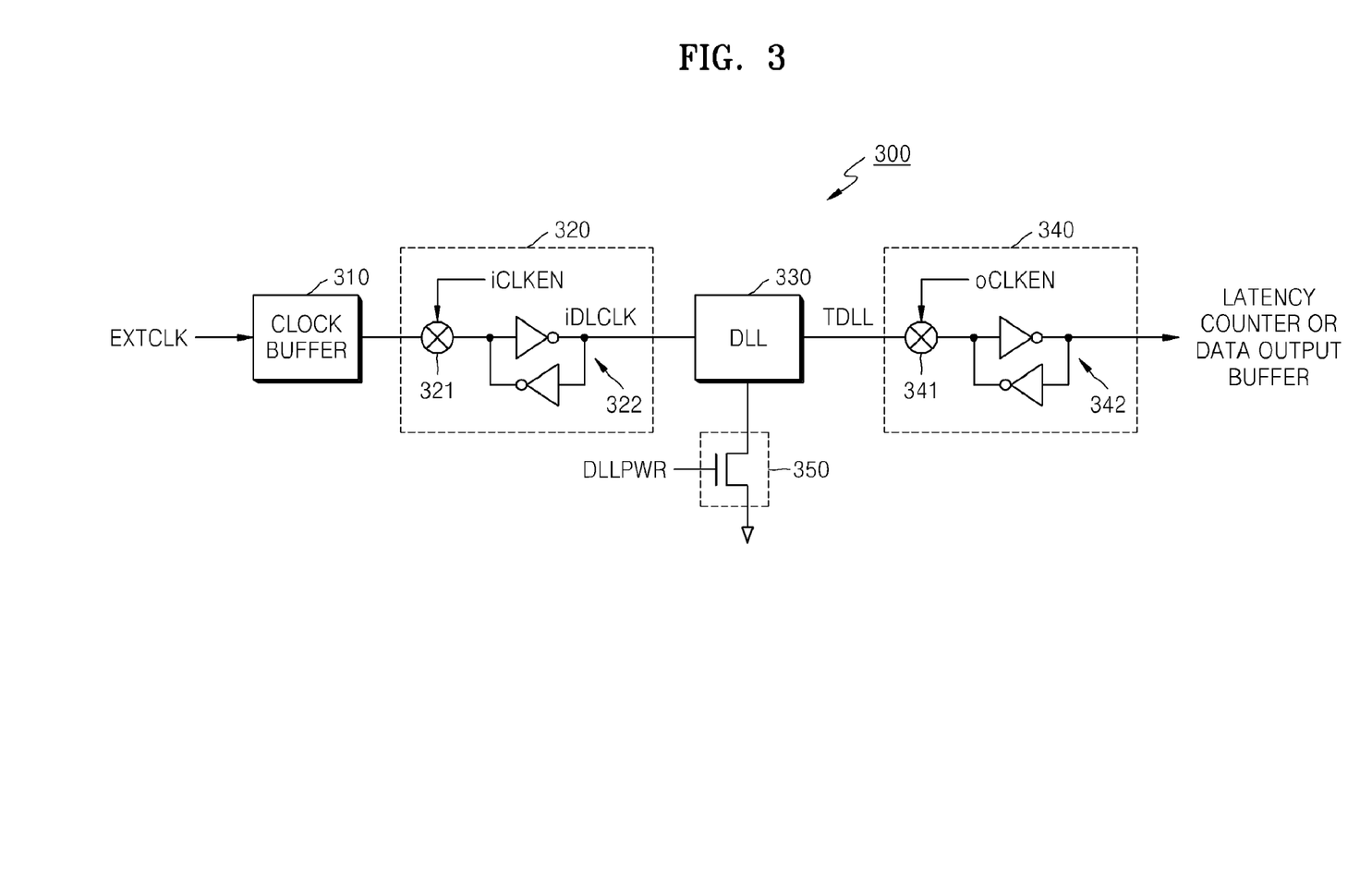
FIG. 3 is a block diagram of a memory device according to an exemplary embodiment of the present invention.

FIG. 3 is a block diagram of a memory device 300 according to an exemplary embodiment of the present invention.

Referring to FIG. 3, the memory device 300 includes a clock buffer 310, a first switch unit 320, a delay locked loop (DLL) 330, a second switch unit 340, and a DLL power-down unit 350.

Figure 5:
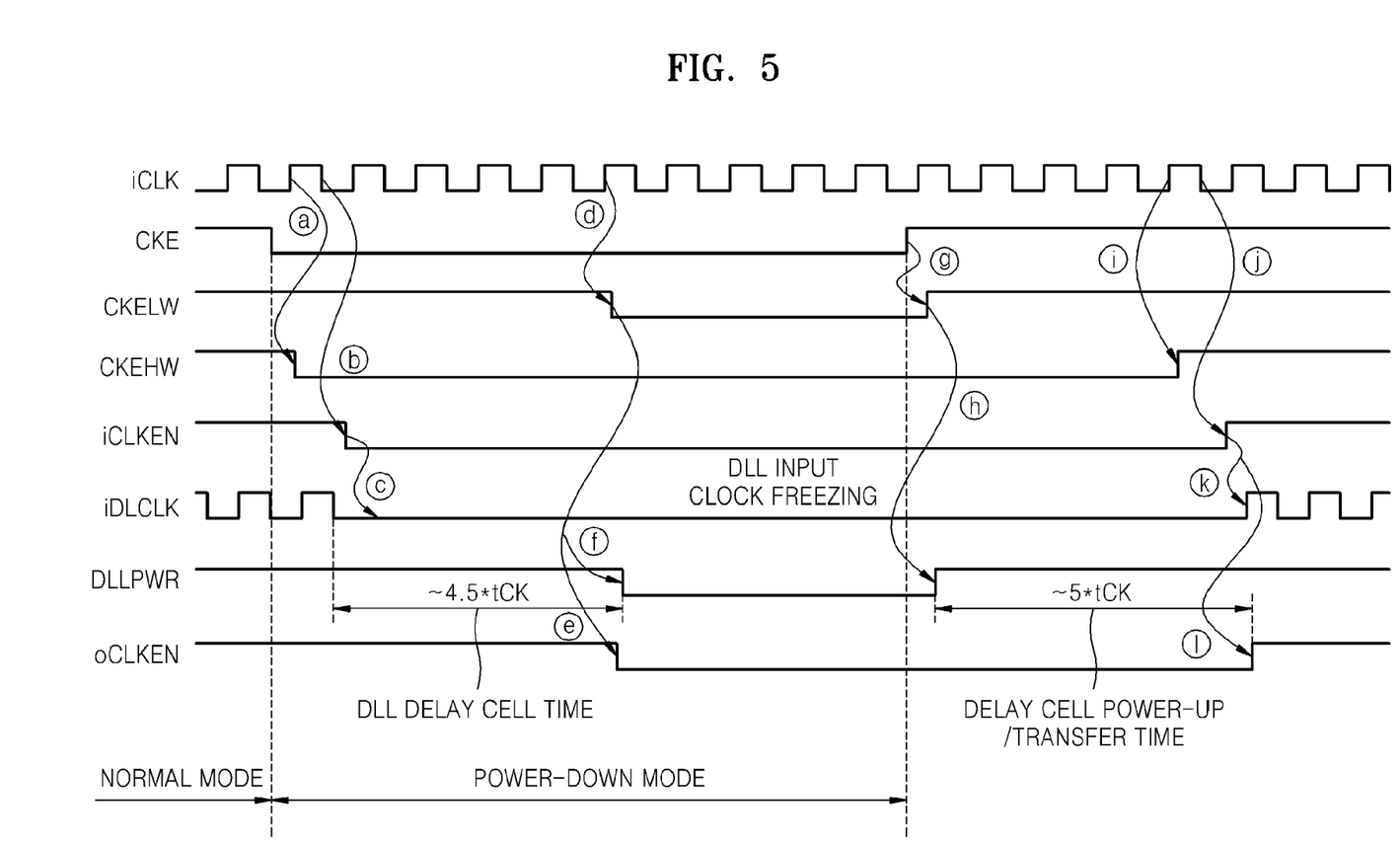
FIG. 5 is a timing diagram of an operation of the DLL control circuit illustrated in FIG. 4, according to an exemplary embodiment of the present invention.

The clock buffer 310 receives an external clock signal EXTCLK and generates a first internal clock signal iCLK shown in FIG. 5. The first switch unit 320 transfers the first internal signal iCLK to the DLL 330 in response to a clock input enable signal iCLKEN. The first switch unit 320 includes a switch 321 transferring the first internal clock signal iCLK in response to the clock input enable signal iCLKEN and a latch 322 latching the first internal clock signal iCLK from the switch 321 to generate a second internal clock signal iDLCLK.

The DLL 330 receives the second internal clock signal iDLCLK to generate a third internal clock signal TDLL that proceeds by a predetermined time in synchronization with the external clock signal EXTCLK. The second switch unit 340 transfers the third internal signal TDLL to the pointer-based latency counter 140 of FIG. 1 or to a data output buffer, such as shown at 160 in FIG. 1, in response to a clock output enable signal oCLKEN. The second switch unit 340 includes a switch 341 transferring the third internal clock signal TDLL in response to the clock output enable signal oCLKEN and a latch 342 latching the third internal clock signal TDLL received from the switch 341. The DLL power-down unit 350 includes a current sink switching a current flowing in the DLL 330 to ground in response to a power-down signal DLLPWR.

Figure 4:
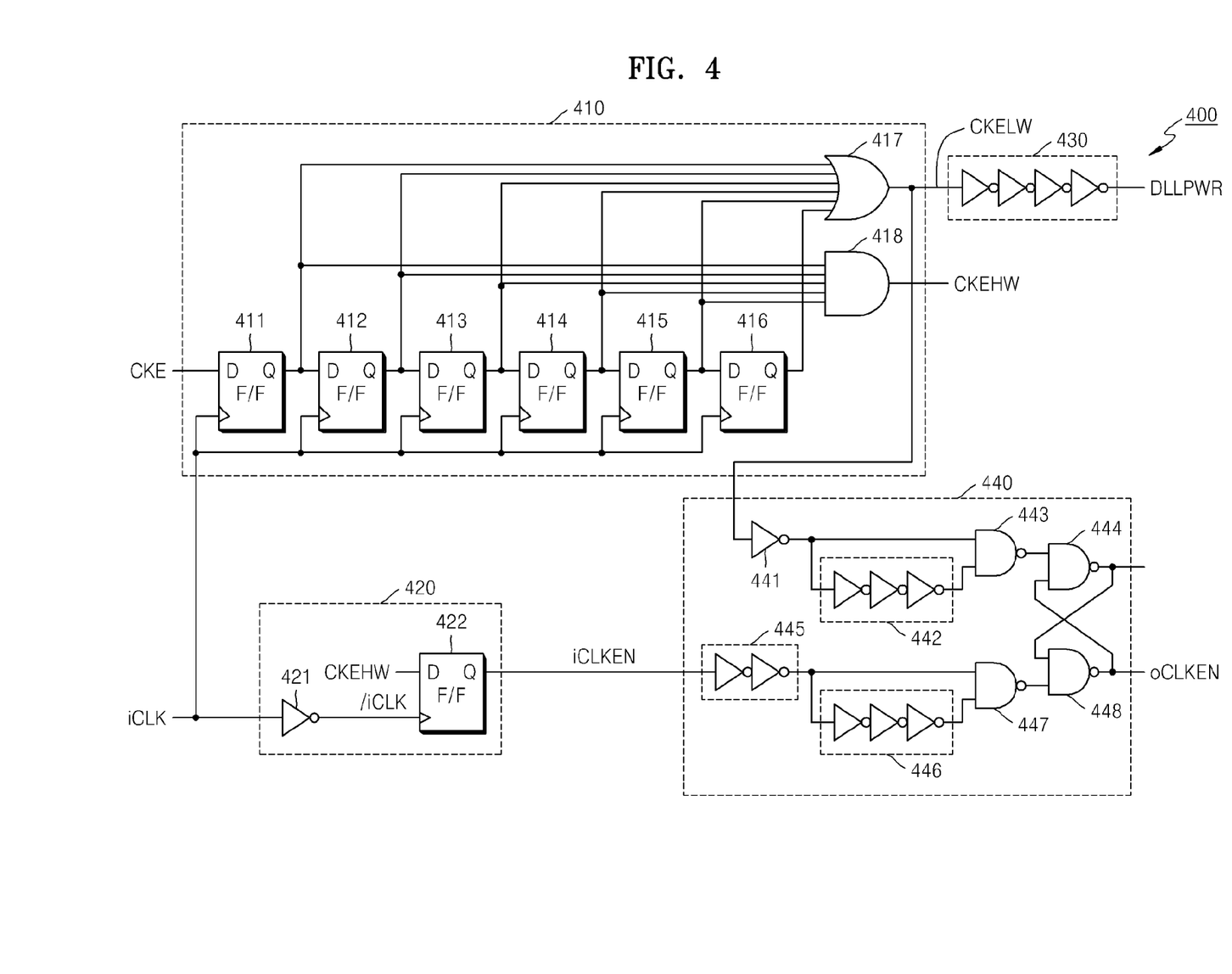
FIG. 4 is a block diagram of a DLL control circuit for controlling a DLL of the memory device illustrated in FIG. 3, according to an exemplary embodiment of the present invention.

FIG. 4 is a block diagram of a DLL control circuit 400 controlling the DLL 330 illustrated in FIG. 3, according to an exemplary embodiment of the present invention.

Referring to FIG. 4, the DLL control circuit 400 provides the clock input enable signal iCLKEN and the clock output enable signal oCLKEN that are described above. The DLL control circuit 400 includes a control signal generator 410, a clock input enable signal generator 420, a power-down signal generator 430, and a clock output enable signal generator 440.

The control signal generator 410 includes an OR gate 417, an AND gate 418, and first, second, third, fourth, fifth, and sixth flip-flops 411, 412, 413, 414, 415, and 416, respectively, that are serially connected to receive the clock enable signal CKE in response to the first internal clock signal iCLK. The output signals Q of the first through sixth flip-flops 411 through 416 are inputted into the OR gate 417 to generate a first control signal CKELW. The first control signal CKELW is generated to be logic LOW when the clock enable signal CKE is logic LOW continuously for over six clock cycles of the first internal clock signal iCLK. The output signals Q of the first through fifth flip-lops 411 through 415 are inputted into the AND gate 418 to generate a second control signal CKEHW. The second control signal CKEHW is generated to be logic HIGH when the clock enable signal CKE is logic HIGH continuously for over five clock cycles of the first internal clock signal iCLK.

The clock input enable signal generator 420 includes an inverter 421 and a flip-flop 422. The inverter 421 receives and inverts the first internal clock signal iCLK as an inverted first internal clock signal /iCLK. In response to the inverted first internal clock signal /iCLK, the flip-flop 422 receives the second control signal CKEHW to output the clock input enable signal iCLKEN. The power-down signal generator 430 includes an inverter chain that receives and delays the first control signal CKELW.

The clock output enable signal generator 440 includes an inverter 441, a first delay unit 442, a first NAND gate 443, a second NAND gate 444, a buffer 445, a second delay unit 446, a third NAND gate 447, and a fourth NAND gate 448. The inverter 441 receives the first control signal CKELW. The first delay unit 442 delays and inverts the output of the inverter 441. The first NAND gate 443 receives the output of the inverter 441 and the output of the first delay unit 442. The second NAND gate 444 receives the clock output enable signal oCLKEN and the output of the first NAND gate 443. The buffer 445 receives the clock input enable signal iCLKEN. The second delay unit 446 delays and inverts the output of the buffer 445. The third NAND gate 447 receives the output of the buffer 445 and the output of the second delay unit 446. The fourth NAND gate 448 receives the output of the second NAND gate 444 and the output of the third NAND gate 447 to output the clock output enable signal oCLKEN.

FIG. 5 is a timing diagram of an operation of the DLL control circuit 400 illustrated in FIG. 4, according to an exemplary embodiment of the present invention.

Referring to FIG. 5, the memory device 300, shown in FIG. 3, operates in a normal mode when the clock enable signal CKE is logic HIGH, and operates in a power-down mode when the clock enable signal CKE is logic LOW. When the clock enable signal CKE changes from logic HIGH to logic LOW, the second control signal CKEHW changes to logic LOW at a rising edge of the first internal clock signal iCLK (ⓐ) and the clock input enable signal iCLKEN changes to logic LOW at a falling edge of the first internal clock signal iCLK (ⓑ). In response to the logic-LOW clock input enable signal iCLKEN, the switch 321 is turned off and the second internal clock iDLCLK is latched to logic LOW (ⓒ).

When the clock enable signal CKE is logic LOW continuously for over six clock cycles of the first internal clock signal iCLK, the first control signal CKELW changes to logic LOW (ⓓ). The six clock cycles of the first internal clock signal iCLK is a predetermined time period that is necessary for the latched second internal clock signal iDLCLK to be completely transferred through the delay cells of the DLL 330, shown in FIG. 3, to an output terminal of the DLL 330. As will be seen by one of ordinary skill in the art, the predetermined time period may be set to a different number of clock cycles other than the six clock cycles used in this exemplary embodiment.

After the clock output enable signal oCLKEN is generated to be logic LOW in response to the logic-LOW first control signal CKELW (ⓔ) the power-down signal DLLPWR is also generated to be logic LOW (ⓕ). Accordingly, the switch 341 of the second switch unit 340 is turned off by the clock output enable signal oCLKEN, and then the DLL 300 is powered down by the power-down signal DLLPWR.

Thereafter, when the clock enable signal CKE changes from logic LOW to logic HIGH in a power-down exit mode, the first control signal CKELW changes to logic HIGH (ⓖ). In response to the logic-HIGH first control signal CKELW, the power-down signal DLLPWR is generated to be logic HIGH (ⓗ). The DLL 300 is powered up by the logic-HIGH power-down signal DLLPWR. After the clock enable signal CKE changes into logic HIGH, the second control signal CKEHW is generated to be logic HIGH at a rising edge of the first internal clock signal iCLK (ⓘ) after five clock cycles and the clock input enable signal iCLKEN is generated to be logic HIGH at the next falling edge (ⓙ). The five clock cycles of the first internal clock signal iCLK is a predetermined time period that is necessary for the latched second internal clock signal iDLCLK to be completely transferred through the delay cells of the DLL 330 to the output terminal of the DLL 330 in the power-down exit mode, it will be seen by one of ordinary skill in the art that the predetermined time period may be set to a different number of clock cycles other than the five clock cycles used in this exemplary embodiment.

In response to the logic-HIGH clock input enable signal iCLKEN, the second internal clock signal iDLCLK is generated according to the first internal clock signal iCLK (ⓚ) and the clock output enable signal oCLKEN is generated to be logic HIGH (ⓛ).

Accordingly, the memory device 300 operates in association with the DLL control circuit 400 as follows: In the power-down mode, the second internal clock signal iDLCLK provided to the DLL 330 is latched to logic LOW in response to the clock input enable signal iCLKEN that is deactivated to be logic LOW directly after the clock enable signal CKE is deactivated to be logic LOW. In addition, the DLL 330 is turned off and the third internal clock signal TDLL from the DLL 330 is latched in response to the clock output enable signal oCLKEN, and the power-down signal DLLPWR that is generated after a predetermined number of clock cycles that are necessary for the latched second internal clock signal iDLCLK to be completely transferred through the delay cells of the DLL 330 to the output terminal of the DLL 330.

Thereafter, in the power-down exit mode, the power-down signal DLLPWR is deactivated to be logic HIGH directly after the clock enable signal CKE is activated to be logic HIGH. In addition, the DLL 330 generates the third internal clock signal TDLL synchronized with the second internal clock signal iDLCLK and provides the third internal clock signal TDLL to a latency counter or to a data output buffer in response to the clock output enable signal oCLKEN and the clock input enable signal iCLKEN that are activated to be logic HIGH after a predetermined number of clock cycles, which are necessary for the latched second internal clock signal iDLCLK to be completely transferred through the delay cells of the DLL 330 to the output terminal of the DLL 330 from the time point when the clock enable signal CKE is activated to be logic HIGH.

Accordingly, there is no probability that a glitch clock pulse will occur in the DLL 330 of the memory device 300.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A memory device comprising:
    a first switch unit transferring a first clock signal in response to a clock input enable signal;
    a delay locked loop (DLL) receiving the first clock signal through the first switch unit to generate a second clock signal, and being turned off by a power-down signal that is generated from the first clock signal latched by the first switch unit; and
    a second switch unit transferring the second clock signal in response to a clock output enable signal.

2. The memory device of claim 1, wherein the first switch unit comprises:
    a switch transferring the first clock signal in response to the clock input enable signal; and
    a latch latching the first clock signal received through the switch.

3. The memory device of claim 1, wherein the second switch unit comprises:
    a switch transferring the second clock signal in response to the clock output enable signal; and
    a latch latching the second clock signal received through the switch.

4. The memory device of claim 1, further comprising a control signal generator generating the clock input enable signal, the control signal generator comprising:
    a plurality of serially connected first flip-flops receiving a clock enable signal in response to the first clock signal;
    an AND gate receiving outputs of the first flip-flops to output a control signal; and
    a second flip-flop receiving the control signal and generating the clock input enable signal in response to an inverted first clock signal.

5. The memory device of claim 4, wherein the number of the plurality of first flip-flops is determined by a number of clock cycles that is necessary for the latched first clock signal to be completely transferred through delay cells of the DLL to an output terminal of the DLL.

6. The memory device of claim 1, further comprising a clock output enable signal generator generating the clock output enable signal, the clock output enable signal generator comprising:
    a plurality of serially connected flip-flops receiving a clock enable signal in response to the first clock signal;
    an OR gate receiving outputs of the flip-flops to generate a control signal;
    an inverter receiving the control signal;
    a first delay unit inverting and delaying an output of the inverter;
    a first NAND gate receiving the output of the inverter and an output of the first delay unit;
    a second NAND gate receiving the clock output enable signal and an output of the first NAND gate;
    a buffer receiving the clock input enable signal;
    a second delay unit inverting and delaying an output of the buffer;
    a third NAND gate receiving the output of the buffer and an output of the second delay unit; and
    a fourth NAND gate receiving an output of the second NAND gate and an output of the third NAND gate to output the clock output enable signal.

7. The memory device of claim 6, further comprising an inverter chain receiving and delaying the control signal to generate the power-down signal.

8. The memory device of claim 6, wherein the number of the plurality of flip-flops is determined by a number of clock cycles that is necessary for the latched first clock signal to be completely transferred through delay cells of the DLL to an output terminal of the DLL.

9. A memory device comprising:
    a control circuit generating a clock input enable signal, a clock output enable signal, and a power-down signal in response to a clock enable signal;
    a first switch unit transferring a first clock signal in response to the clock input enable signal;
    a delay locked loop (DLL) receiving the first clock signal through the first switch unit to generate a second clock signal;
    a DLL power-down unit turning off the DLL in response to the power-down signal; and
    a second switch unit transferring the second clock signal in response to the clock output enable signal.

10. The memory device of claim 9, wherein the control circuit comprises:
    a plurality of serially connected first flip-flops receiving a clock enable signal in response to the first clock signal;
    an AND gate receiving outputs of the first flip-flops to output a control signal; and
    a second flip-flop receiving the control signal and generating the clock input enable signal in response to an inverted first clock signal.

11. The memory device of claim 10, wherein the number of the plurality of first flip-flops is determined by a number of clock cycles that is necessary for the latched first clock signal to be completely transferred through delay cells of the DLL to an output terminal of the DLL.

12. The memory device of claim 9, wherein the control circuit comprises:
- a plurality of serially connected flip-flops receiving a clock enable signal in response to the first clock signal;
- an OR gate receiving outputs of the flip-flops to generate a control signal;
- an inverter receiving the control signal;
- a first delay unit inverting and delaying an output of the inverter;
- a first NAND gate receiving the output of the inverter and an output of the first delay unit;
- a second NAND gate receiving the clock output enable signal and an output of the first NAND gate;
- a buffer receiving the clock input enable signal;
- a second delay unit inverting and delaying an output of the buffer;
- a third NAND gate receiving the output of the buffer and an output of the second delay unit; and
- a fourth NAND gate receiving an output of the second NAND gate and an output of the third NAND gate to output the clock output enable signal.

13. The memory device of claim 12, wherein the number of the plurality of flip-flops is determined by a number of clock cycles that is necessary for the latched first clock signal to be completely transferred through delay cells of the DLL to an output terminal of the DLL.

14. The memory device of claim 12, wherein the control circuit further comprises an inverter chain receiving and delaying the control signal to generate the power-down signal.

15. The memory device of claim 9, wherein the first switch unit comprises:
- a switch transferring the first clock signal in response to the clock input enable signal; and
- a latch latching the first clock signal received through the switch.

16. The memory device of claim 9, wherein the second switch unit comprises:
- a switch transferring the second clock signal in response to the clock output enable signal; and
- a latch latching the second clock signal received through the switch.

17. The memory device of claim 9, wherein the DLL power-down unit comprises a current sink blocking a path from the DLL to a ground voltage point in response to the power-down signal.

18. A method for controlling a delay locked loop (DLL) comprising:
- generating a clock input enable signal and a clock output enable signal in response to a clock enable signal;
- transferring a first clock signal to the DLL or blocking the first clock signal in response to the clock input enable signal;
- generating a second clock signal synchronized with the first clock signal at the DLL;
- transferring the second clock signal to a data output buffer in response to the clock output enable signal;
- generating a power-down signal when the clock enable signal is deactivated continuously for a predetermined number of clock cycles; and
- turning off the DLL in response to the power-down signal.

19. The method of claim 18, wherein the power-down signal is generated after a predetermined number of clock cycles that is necessary for the latched first clock signal to be completely transferred through delay cells of the DLL to an output terminal of the DLL.

20. The method of claim 18, wherein the clock input enable signal is deactivated in response to an edge of the first clock signal after the time point when the clock enable signal is deactivated.

21. The method of claim 18, wherein the clock input enable signal is activated after a predetermined number of clock cycles of the first clock signal that necessary for the latched first clock signal to be completely transferred through delay cells of the DLL to an output terminal of the DLL from a time point when the clock enable signal is activated.

22. The method of claim 18, wherein the clock output enable signal is activated or deactivated after a predetermined number of clock cycles of the first clock signal that is necessary for the latched first clock signal to be completely transferred through delay cells of the DLL to an output terminal of the DLL from a time point when the clock enable signal is activated or deactivated.

* * * * *